(12) United States Patent
Tsuchiya

(10) Patent No.: US 8,427,191 B2
(45) Date of Patent: Apr. 23, 2013

(54) POWER SOURCE DEVICE AND IMAGE FORMING APPARATUS HAVING THE SAME

(75) Inventor: Satoru Tsuchiya, Tokyo (JP)

(73) Assignee: Oki Data Corporation, Tokyo (JP)

( * ) Notice: Subject to any disclaimer, the term of this patent is extended or adjusted under 35 U.S.C. 154(b) by 335 days.

(21) Appl. No.: 12/844,878

(22) Filed: Jul. 28, 2010

(65) Prior Publication Data

US 2011/0025368 A1 Feb. 3, 2011

(30) Foreign Application Priority Data

Jul. 30, 2009 (JP) ................................. 2009-177215

(51) Int. Cl.
*G01R 31/40* (2006.01)
*G03G 15/00* (2006.01)

(52) U.S. Cl.
USPC ........................................ 324/764.01; 399/88

(58) Field of Classification Search .................. None
See application file for complete search history.

(56) References Cited

U.S. PATENT DOCUMENTS

| 5,546,161 A | * | 8/1996 | Sakai et al. | ................. | 399/16 |
| 7,705,485 B2 | * | 4/2010 | Iwata | .................. | 307/38 |
| 8,001,398 B2 | * | 8/2011 | Tamasaki | ................. | 713/310 |
| 2002/0126113 A1 | * | 9/2002 | Iwasaki | ................. | 345/211 |
| 2011/0311259 A1 | * | 12/2011 | Hayasaki et al. | ................. | 399/88 |
| 2011/0311260 A1 | * | 12/2011 | Nakajima et al. | ................. | 399/88 |

FOREIGN PATENT DOCUMENTS

| JP | 01-278255 A | | 11/1989 |
| JP | 07-298612 A | | 11/1995 |
| JP | 09185437 A | * | 7/1997 |
| JP | 2001-086663 | | 3/2001 |
| JP | 2002-325434 A | | 11/2002 |

OTHER PUBLICATIONS

English Translation of JP09-185437 filed on Jul. 15, 1997.*

* cited by examiner

*Primary Examiner* — Jermele M Hollington
(74) *Attorney, Agent, or Firm* — Kubotera & Associates, LLC

(57) ABSTRACT

A power source device includes a main power source for outputting a direct current voltage with a specific value; a monitoring unit connected to the main power source for comparing the direct current voltage with a reference voltage to monitor whether a malfunction occurs in the main power source; and a monitoring display unit connected to the monitoring unit. The monitoring unit includes a comparison unit for comparing the direct current voltage with the reference voltage, and a monitoring control unit for detecting a signal of the comparison unit and for storing and displaying the direct current voltage on the monitoring display unit when the malfunction occurs in the main power source.

14 Claims, 6 Drawing Sheets

POWER SOURCE DEVICE AND IMAGE FORMING APPARATUS HAVING THE SAME

BACKGROUND OF THE INVENTION AND RELATED ART STATEMENT

The present invention relates to a power source device and an image forming apparatus having the power source device.

A conventional image forming apparatus such as a printer, a copier, a facsimile, and a multi function product having functions thereof is provided with a conventional power source device. The conventional power source device converts an AC (Alternative Current) voltage input from a commercial power source to a direct current voltage with a specific value using a harmonic current suppression circuit and a DC/DC (Direct Current) converter.

The conventional power source device may include a backup battery. When the conventional power source device is not capable of outputting the direct current voltage with the specific value, that is, an abnormality occurs in the harmonic current suppression circuit, the battery outputs the direct current voltage with the specific value.

Further, the conventional power source device may include an alarm device for notifying an abnormality of the conventional power source device to an operator when an output direct current voltage decreases due to a malfunction in the harmonic current suppression circuit and the like (refer to Patent Reference).

Patent Reference Japanese Patent Publication No. 4096470

In the conventional power source device disclosed in Patent Reference, the alarm device is provided for notifying the abnormality of the conventional power source device to an operator. Accordingly, the operator is capable of confirming the abnormality of the conventional power source device. However, the operator is not capable of confirming which circuit or component of the conventional power source device has the abnormality. Accordingly, in order to repair the conventional power source device, it takes a long period of time for the operator to identify a cause of the malfunction such as which circuit or component of the conventional power source device has the abnormality.

In view of the problems described above, an object of the present invention is to provide a power source device capable of solving the problems of the conventional power source device. In the present invention, it is possible to identify a cause of a malfunction in a short period of time. A further object of the present invention is to provide an image forming apparatus using the power source device.

Further objects and advantages of the invention will be apparent from the following description of the invention.

SUMMARY OF THE INVENTION

In order to attain the objects described above, according to the present invention, a power source device includes a main power source for outputting a direct current voltage with a specific value; a monitoring unit connected to the main power source for comparing the direct current voltage with a reference voltage to monitor whether a malfunction occurs in the main power source; and a monitoring display unit connected to the monitoring unit. The monitoring unit includes a comparison unit for comparing the direct current voltage with the reference voltage, and a monitoring control unit for detecting a signal of the comparison unit and for storing and displaying the direct current voltage on the monitoring display unit when the malfunction occurs in the main power source.

In the power source device of the present invention, the monitoring unit is provided for monitoring the direct current voltage with the reference voltage as a standard. The comparison unit is provided for comparing the direct current voltage with the reference voltage to determine whether the malfunction occurs in the main power source. Further, the monitoring control unit is provided for storing and displaying the direct current voltage on the monitoring display unit when the malfunction occurs in the main power source.

Accordingly, it is possible for an operator to confirm a value of the direct current voltage when the malfunction occurs in the main power source. As a result, the operator can identify a location of the malfunction or a cause of the malfunction based on the value of the direct current voltage when the malfunction occurs in the main power source. In the present invention, it is possible to identify the location of the malfunction or the cause of the malfunction in a short period of time.

DETAILED DESCRIPTION OF PREFERRED EMBODIMENTS

Figure 1:
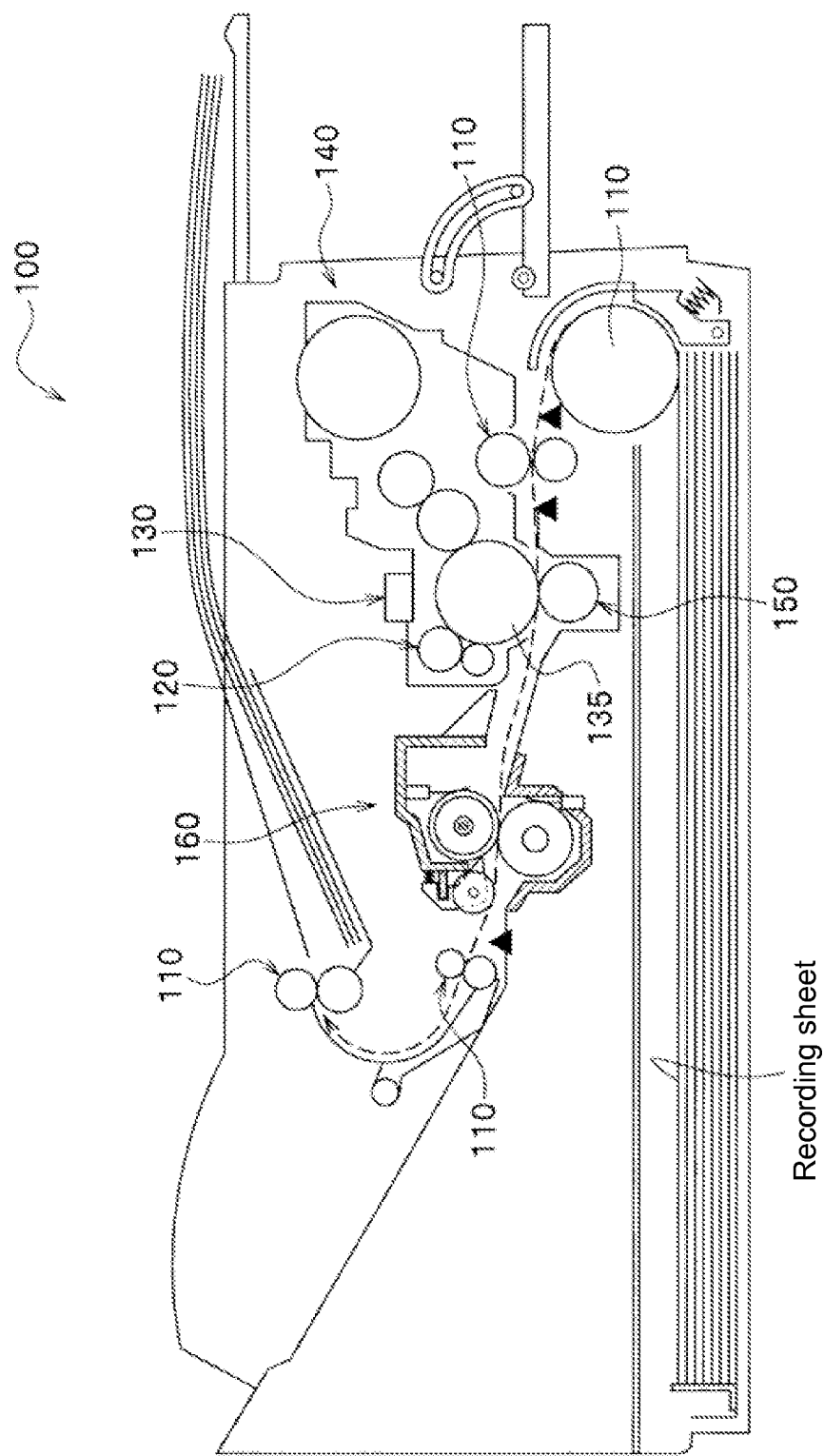
FIG. 1 is a schematic side view showing an image forming apparatus according to a first embodiment of the present invention.

Hereunder, embodiments of the present invention will be explained with reference to the accompanying drawings. The accompanying drawings are shown for explanation purpose only, and the present invention is not limited to the accompanying drawings. In the accompanying drawings, same components or similar components are designated with the same reference numerals, and explanations thereof are omitted.

First Embodiment

A configuration of an image forming apparatus 100 according to a first embodiment of the present invention will be explained with reference to the accompanying drawings. The image forming apparatus 100 is configured to output a recording sheet on which a toner image is fixed according to image data input thereto.

FIG. 1 is a schematic side view showing the image forming apparatus 100 according to the first embodiment of the present invention. As shown in FIG. 1, the image forming apparatus 100 includes a transportation unit 110 for transporting the recording sheet; an image forming unit 140 having a charge roller 120 and an exposure unit 130 for forming the toner image; a transfer roller 150 for transferring the toner image to the recording sheet; and a fixing unit 160 for fixing the toner image transferred to the recording sheet.

Figure 2:
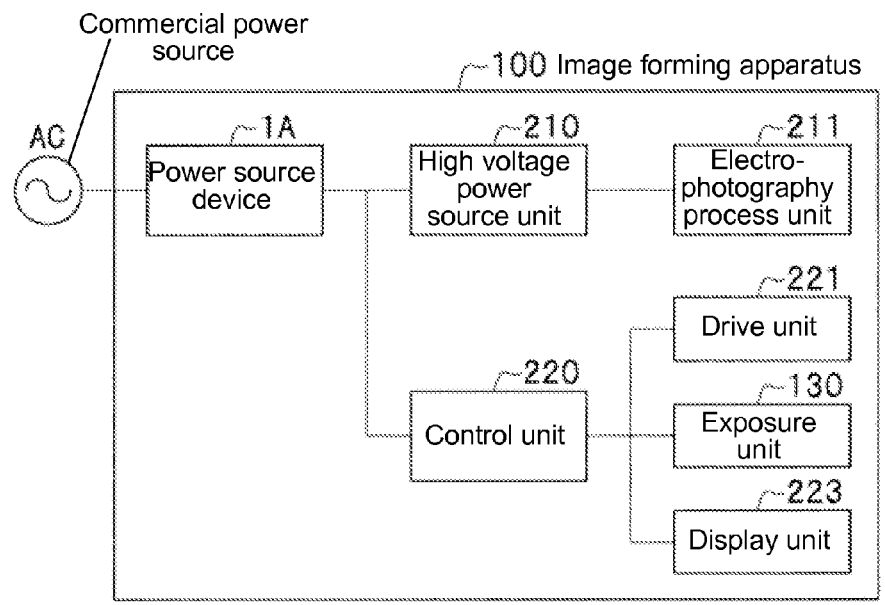
FIG. 2 is a block diagram showing a configuration of the image forming apparatus including a power source device according to the first embodiment of the present invention.

FIG. 2 is a block diagram showing a configuration of the image forming apparatus 100 including a power source device 1A according to the first embodiment of the present invention.

As shown in FIG. 2, the image forming apparatus 100 further includes the power source device 1A connected to a commercial power source AC for outputting a direct current voltage $V_D$ with a specific value to drive the transportation unit 110 and the like. Further, the image forming apparatus 100 includes a high voltage power source unit 210, an electrophotography process unit 211, a control unit 220, a drive unit 221, the exposure unit 130, and a display unit 223.

In the embodiment, the high voltage power source unit 210 includes a high voltage generation transformer and the like, and is connected to the power source device 1A for increasing the direct current voltage Vd applied from the power source device 1A to a high voltage to be applied to the electrophotography process unit 211. Further, the electro-photography process unit 211 is provided for applying a high voltage to the charge roller 120, the transfer roller 150, the fixing unit 160, and the like shown in FIG. 1.

In the embodiment, the control unit 220 is connected to the power source device 1A for supplying the direct current voltage supplied from the power source device 1A to the drive unit 221, the exposure unit 130, and the display unit 223 according to a control program installed therein in advance. Further, the drive unit 221 is formed of a motor (not shown) for driving the transportation unit 110 shown in FIG. 1. The control unit 220 supplies a direct current voltage to the drive unit 221, so that the drive unit 221 drives the transportation unit 110 to transport the recording sheet.

In the embodiment, the exposure unit 130 is formed of an LED (Light Emitting Diode) array and the likes. The control unit 220 supplies power to the exposure unit 130, so that the exposure unit 130 forms a static latent image on a photosensitive drum 135. Further, the display unit 223 is provided for displaying a state of the image forming apparatus 100 according to a signal transmitted from the control unit 220 of the image forming apparatus 100.

In the embodiment, the power source device 1A is connected to the commercial power source AC for converting a voltage input from the commercial power source AC to the direct current voltage $V_D$ with the specific value, so that the power source device 1A outputs the direct current voltage $V_D$ thus converted.

As described above, FIG. 2 is a block diagram showing a configuration of the image forming apparatus 100 including the power source device 1A according to the first embodiment of the present invention. As shown in FIG. 2, in the image forming apparatus 100, the high voltage power source unit 210 is connected to the control unit 220.

In the embodiment, the direct current voltage $V_D$ with the specific value has a level such as, for example, +5 V, necessary for the high voltage power source unit 210 and the control unit 220.

Figure 3:
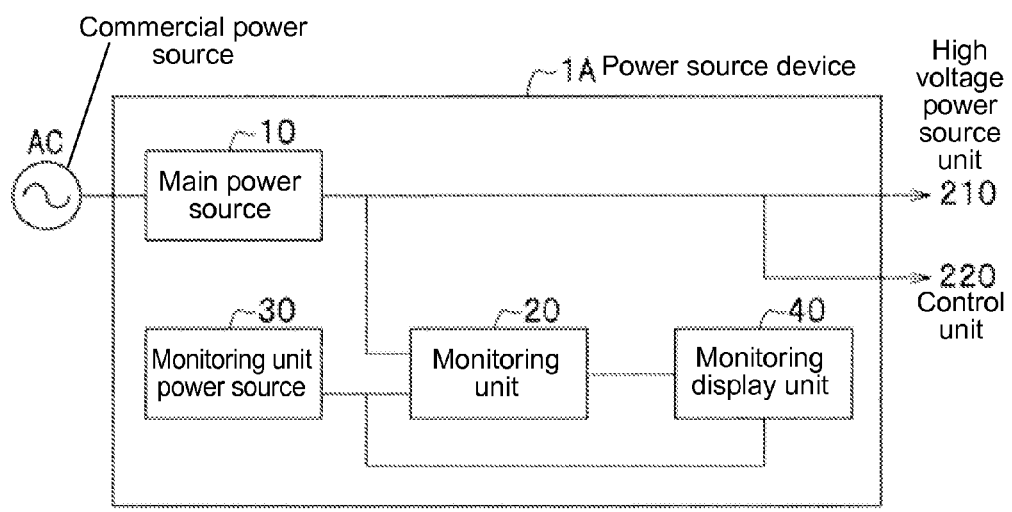
FIG. 3 is a block diagram showing a configuration of the power source device according to the first embodiment of the present invention.

FIG. 3 is a block diagram showing a configuration of the power source device 1A according to the first embodiment of the present invention. As shown in FIG. 3, the power source device 1A includes a main power source 10 connected to the commercial power source AC; a monitoring unit 20 for monitoring a voltage value output from the main power source 10; a monitoring unit power source 30 connected to the monitoring unit 20; and a monitoring display unit 40.

In the embodiment, the main power source 10 is provided for converting an alternate current voltage supplied from the commercial power source AV to the direct current voltage $V_D$ with the specific value. The main power source 10 includes a boost chopper type circuit, a DC/DC converter circuit, and the like. Alternatively, the main power source 10 may include other types of circuits.

Figure 4:
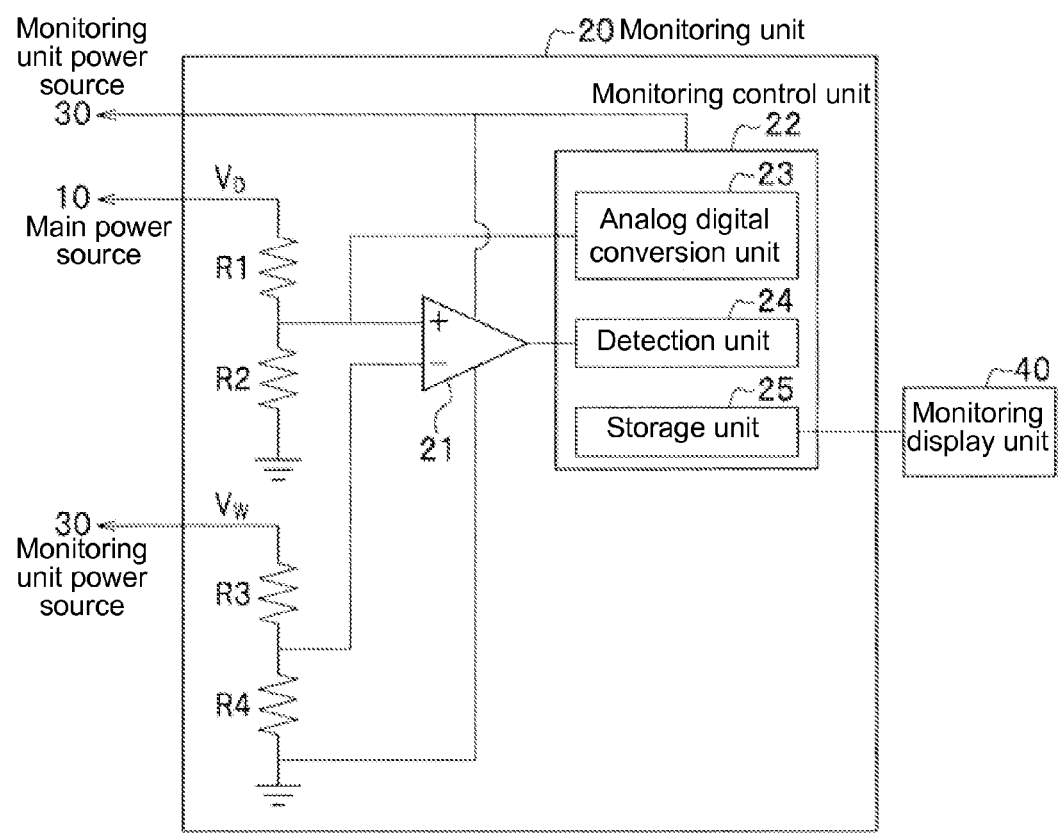
FIG. 4 is a block diagram showing a configuration of a monitoring unit of the power source device according to the first embodiment of the present invention.

FIG. 4 is a block diagram showing a configuration of the monitoring unit 20 of the power source device 1A according to the first embodiment of the present invention. In the embodiment, the monitoring unit 20 is configured to compare the direct current voltage $V_D$ output from the main power source 10 with a reference voltage $V_W$ output from the monitoring unit power source 30, so that the monitoring unit 20 monitors a value of the voltage output from the main power source 10.

As shown in FIG. 4, the monitoring unit 20 includes a comparator 21 for comparing the direct current voltage $V_D$ output from the main power source 10 with the reference voltage $V_W$ output from the monitoring unit power source 30; and a monitoring control unit 22. When the direct current voltage $V_D$ output from the main power source 10 exceeds a specific level, the monitoring control unit 22 receives a signal transmitted from the comparator 21 and stores the direct current voltage $V_D$. Further, the monitoring control unit 22 is configured to display the direct current voltage $V_D$ on the monitoring display unit 40.

In the embodiment, the monitoring unit 20 has an input terminal connected to an output terminal of the main power source 10, and the input terminal is connected to a resistor R1 and a resistor R2 in series. An opposite end portion of the resistor R2 is grounded. Similarly, the monitoring unit 20 has another input terminal connected to an output terminal of the monitoring unit power source 30, and the input terminal is connected to a resistor R3 and a resistor R4 in series. An opposite end portion of the resistor R4 is grounded.

In the embodiment, the comparator 21 has a non-inversion input terminal + connected to one end portion of the resistor R2 and an inversion input terminal − connected to one end portion of the resistor R4. Accordingly, the direct current voltage $V_D$ output from the main power source 10 and the reference voltage $V_W$ output from the monitoring unit power source 30 are divided and input to the comparator 21.

In the embodiment, when a potential input to the non-inversion input terminal + is greater than that input to the inversion input terminal −, the comparator 21 outputs a signal with a high level. When a potential input to the non-inversion input terminal + is smaller than that input to the inversion input terminal −, the comparator 21 outputs a signal with a low level.

Accordingly, when the direct current voltage $V_D$ output from the main power source 10 is greater than the reference voltage $V_W$ output from the monitoring unit power source 30, the comparator 21 outputs the signal with the high level. When the direct current voltage $V_D$ output from the main power source 10 is smaller than the reference voltage $V_W$ output from the monitoring unit power source 30, the comparator 21 outputs the signal with the low level.

In the embodiment, the comparator 21 compares the direct current voltage $V_D$ output from the main power source 10 with the reference voltage $V_W$ output from the monitoring unit power source 30, so that the comparator 21 monitors whether the main power source 10 has an abnormality. In this case, the comparator 21 corresponds to a comparison unit. Further, when the main power source 10 has an abnormality, the direct current voltage $V_D$ output from the main power source 10 exceeds the reference voltage $V_w$ output from the monitoring unit power source 30, and the comparator 21 outputs the signal with the high level.

In the embodiment, when the monitoring control unit 22 receives a signal output from the comparator 21, the monitoring control unit 22 stores the direct current voltage $V_D$ output from the main power source 10. The monitoring control unit 22 includes an analog digital conversion unit 23, a detection unit 24, and a storage unit 25.

In the embodiment, the analog digital conversion unit 23 is connected to one end portion of the resistor R2 for performing a digital process on the direct current voltage $V_D$ output from the main power source 10. The analog digital conversion unit 23 is formed of an A/D converter and the like.

In the embodiment, when the detection unit 24 receives the signal with the high level from the comparator 21, the detection unit 24 stores "01" in the storage unit 25 indicating that an excessive voltage is generated. Further, the detection unit 24 increments a storage address of data, so that the detection unit 24 stores a voltage value detected with the analog digital conversion unit 23. Further, the detection unit 24 displays the data stored in the storage unit 25 on the monitoring display unit 40.

In the embodiment, the detection unit 24 is formed of a CPU (Central Processing unit, not shown), an ROM (Read Only Memory), a program, and the like for performing the operation described above. Note that the detection unit 24 includes an interruption process program, so that the detection unit 24 stores the data in the storage unit 25 when the detection unit 24 receives the signal with the high level from the comparator 21, even when the CPU is performing another process.

In the embodiment, the storage unit 25 stores a value of the direct current voltage VD when the comparator 21 outputs the signal with the high level. It is preferred that the storage unit 25 is formed of a non-volatile memory such as an EEPROM (Electrically Erasable PROM) and the like. Accordingly, even when the monitoring unit power source 30 stops supplying power to the storage unit 25, the storage unit 25 can hold data.

In the embodiment, the monitoring unit power source 30 supplies power to drive the comparator 21 and the monitoring control unit 22. Accordingly, even when the main power source 10 is broken down, with the monitoring unit power source 30, it is possible to securely display an abnormality of the main power source 10 and a voltage value at that moment.

Figure 5:
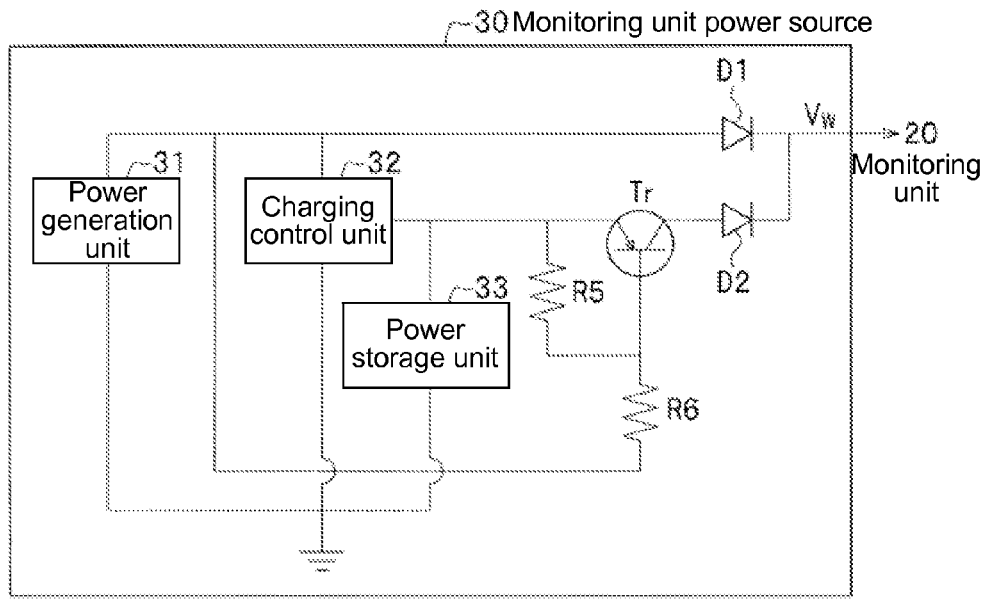
FIG. 5 is a block diagram showing a configuration of a monitoring unit power source of the power source device according to the first embodiment of the present invention.

As shown in FIG. 3, the monitoring unit power source 30 is connected to the monitoring unit 20 and the monitoring display unit 40, so that the monitoring unit power source 30 supplies a startup voltage to the monitoring unit 20 and the monitoring display unit 40 to startup. FIG. 5 is a block diagram showing a configuration of the monitoring unit power source 30 of the power source device 1A according to the first embodiment of the present invention.

As shown in FIG. 5, the monitoring unit power source 30 includes a power generation unit 31, a charging control unit 32, and a power storage unit 33. The power generation unit 31 is formed of a solar battery for directly converting solar power to electric power through a photovoltaic effect. More specifically, the power generation unit 31 includes a solar battery panel disposed on an upper portion of the image forming apparatus 100 for receiving solar power, so that the power generation unit 31 performs photovoltaic conversion.

In the embodiment, the power generation unit 31 is connected to an output terminal of the monitoring unit power source 30 through a diode D1. Further, the charging control unit 32 is connected to the power generation unit 31 in parallel through the charging control unit 32, so that the charging control unit 32 controls the power storage unit 33 to store power of the power generation unit 31. When the main power source 10 outputs the direct current voltage of +5 V, the monitoring unit power source 30 outputs a voltage greater than +5 V.

In the monitoring unit power source 30, a transistor Tr has an emitter connected to the power storage unit 33, and a collector connected to the output terminal through a diode D2. Further, the transistor Tr has a base connected to the power generation unit 31. Accordingly, when the voltage of the power generation unit 31 becomes smaller than the voltage of the power storage unit 33, the voltage of the power storage unit 33 is output from the output terminal through the transistor Tr and the diode D2.

Figure 6:
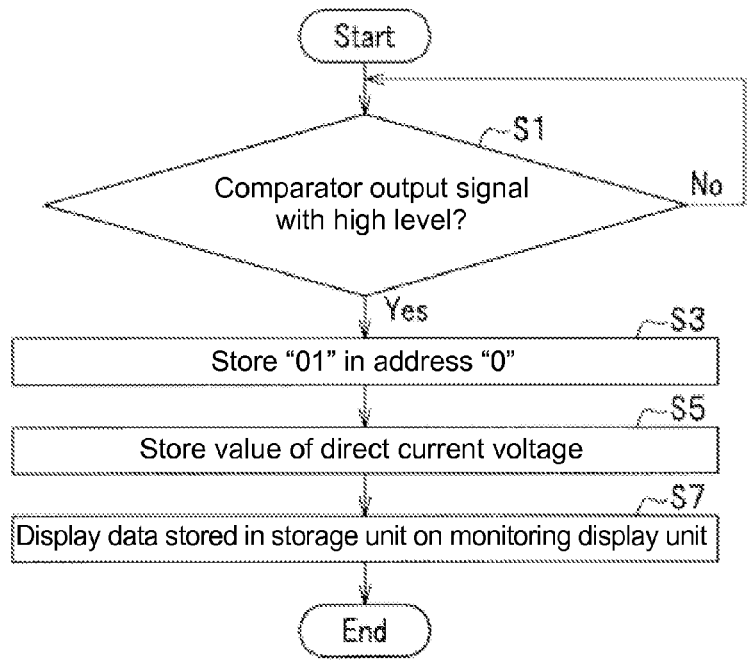
FIG. 6 is a flow chart showing an operation of a monitoring control unit of the monitoring unit of the power source device according to the first embodiment of the present invention.
Figures 7, 8:
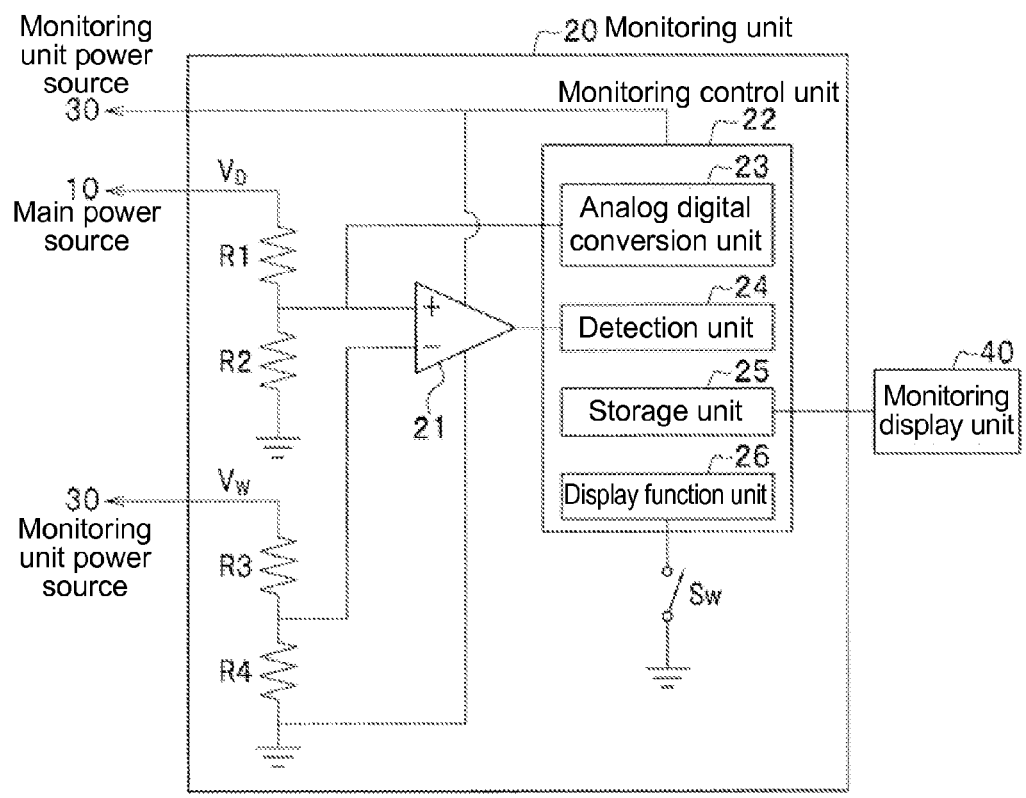
FIG. 7 is a schematic view showing contents of a storage unit of the monitoring unit of the power source device according to the first embodiment of the present invention.
FIG. 8 is a block diagram showing a configuration of a monitoring unit of a power source device according to a second embodiment of the present invention.

An operation of the monitoring control unit 22 will be explained next with reference to FIGS. 6 and 7. FIG. 6 is a flow chart showing the operation of the monitoring control unit 22 of the monitoring unit 20 of the power source device 1A according to the first embodiment of the present invention. FIG. 7 is a schematic view showing contents of the storage unit 25 of the monitoring unit 20 of the power source device 1A according to the first embodiment of the present invention.

As described above, the comparator 21 of the monitoring unit 20 is connected to the main power source 10 and the monitoring unit power source 30. Accordingly, at the start of the flow chart shown in FIG. 6, the comparator 21 outputs the signal with the high level or the signal with the low level to the detection unit 24 of the monitoring control unit 22.

In step S1, the detection unit 24 determines whether the comparator 21 outputs the signal with the high level. When the detection unit 24 determines that the comparator 21 outputs the signal with the high level (Yes in step S1), in step S3, the detection unit 24 stores "01" in an address "0" corresponding to first data stored in the storage unit 25 as shown in FIG. 7 as an interruption process, indicating that an excess voltage is generated. When the detection unit 24 determines that the comparator 21 outputs the signal with the low level (No in step S1), the detection unit 24 continues to monitor.

In step S5, the detection unit 24 stores a value of the direct current voltage $V_D$ measured with the analog digital conversion unit 23 in the storage unit 25 in the interruption process as shown in FIG. 7. When the detection unit 24 continues to detect the signal with the high level from the comparator 21, the detection unit 24 increases a record address of the storage unit 25, so that the detection unit 24 continues to store a value of the direct current voltage $V_D$ measured with the analog digital conversion unit 23 in the storage unit 25.

In step S7, the detection unit 24 displays the data stored in the storage unit 25 on the monitoring display unit 40, thereby completing the process.

As described above, in the embodiment, in the power source device 1A, when the direct current voltage $V_D$ is an excess voltage, the detection unit 24 displays on the monitoring display unit 40 that the direct current voltage $V_D$ is an excess voltage, and displays a value of the direct current voltage $V_D$. Accordingly, an operator can identify a cause of malfunction based on the value of the direct current voltage $V_D$. As a result, it is possible to reduce a period of time for identifying the cause.

Further, when the direct current voltage $V_D$ is an excess voltage, the detection unit 24 performs the interruption process. Accordingly, it is possible to display the malfunction of the power source device 1A on the monitoring display unit 40 in a short period of time. Further, the monitoring unit power source 30 supplies the reference voltage $V_W$ to the monitoring unit 20 and the monitoring display unit 40 to drive the monitoring unit 20 and the monitoring display unit 40. Accordingly, even when the power source device 1A is broken down, it is possible to securely display malfunction of the main power source 10 and the voltage value upon the malfunction.

Note that the present invention is not limited to the embodiment described above. For example, the monitoring unit 20 may be configured such that the power generation unit 31 generates the reference voltage $V_W$ smaller than the voltage supplied from the main power source 10, so that the monitoring unit 20 monitors whether a voltage greater than a specific voltage value is supplied.

Further, the power source device 1A is provided with the monitoring display unit 40 for displaying the contents stored in the storage unit 25, and the image forming apparatus 100 may be provided with the display unit 223 for displaying the contents stored in the storage unit 25. Further, the power generation unit 31 of the monitoring unit power source 30 is formed of the solar battery panel, and may be formed of a battery.

Second Embodiment

A second embodiment of the present invention will be explained next with reference to FIG. 8. FIG. 8 is a block diagram showing a configuration of the monitoring unit 20 of the power source device 1B according to the second embodiment of the present invention.

As shown in FIG. 8, in the power source device 1A in the second embodiment, different from the first embodiment, the monitoring unit 20 includes a switch SW and a display function unit 26.

In the embodiment, the switch SW is provided for starting a function of the display function unit 26. When the switch SW is turned off, the display function unit 26 displays the data stored in the storage unit 25 on the monitoring display unit 40.

In the first embodiment, after the detection unit 24 stores the voltage value detected with the analog digital conversion unit 23 in the storage unit 25, the detection unit 24 automatically displays the data stored in the storage unit 25 on the monitoring display unit 40. In the second embodiment, after the detection unit 24 stores the voltage value detected with the analog digital conversion unit 23 in the storage unit 25, the detection unit 24 does not automatically display the data stored in the storage unit 25 on the monitoring display unit 40.

Figure 9:
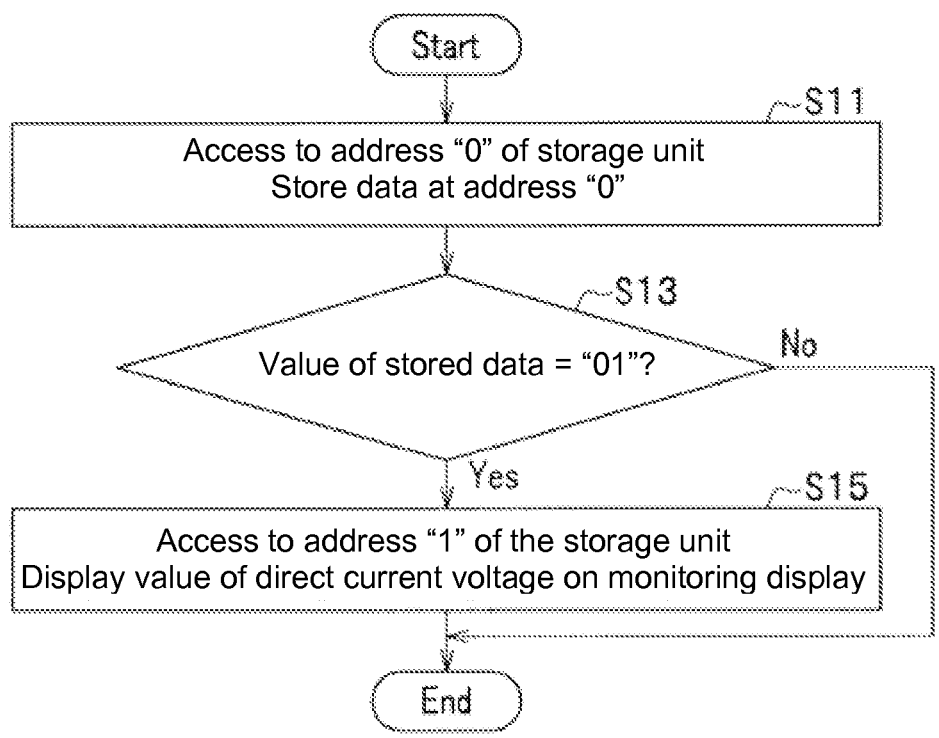
FIG. 9 is a flow chart showing an operation of a display function unit of a monitoring control unit of the monitoring unit of the power source device according to the second embodiment of the present invention.

An operation of the display function unit 26 will be explained next with reference to FIG. 9. FIG. 9 is a flow chart showing the operation of the display function unit 26 of the monitoring control unit 22 of the monitoring unit 20 of the power source device 1A according to the second embodiment of the present invention.

At the start of the flow chart shown in FIG. 9, the switch SW is turned off. In step S11, the display function unit 26 accesses to the address "0" of the storage unit 25 where the data are stored for the first time, so that the display function unit 26 temporarily stores the data stored at the address "0".

In step S13, the display function unit 26 determines whether a value of the data thus stored is "01". In step S15, when the display function unit 26 determines that the value of the data thus stored is "01", the display function unit 26 accesses to the address "1" of the storage unit 25. Accordingly, the display function unit 26 displays the value of the direct current voltage $V_D$ stored in the storage unit 25 on the monitoring display unit 40, thereby completing the process. When the display function unit 26 determines that the value of the data thus stored is "00", the process is completed as is.

As described above, in the power source device 1A in the second embodiment, only when the switch SW is turned off, the abnormality of the power source device 1A is displayed. Accordingly, it is possible to reduce power consumption of the monitoring unit power source 30.

The disclosure of Japanese Patent Application No. 2009-177215, filed on Jul. 30, 2009, is incorporated in the application.

While the invention has been explained with reference to the specific embodiments of the invention, the explanation is illustrative and the invention is limited only by the appended claims.

What is claimed is:

1. A power source device comprising:
    a main power source for outputting a direct current voltage with a specific value;
    a monitoring unit connected to the main power source for comparing the direct current voltage with a reference voltage to monitor whether a malfunction occurs in the main power source;
    a monitoring unit power source connected to the monitoring unit for outputting the reference voltage; and
    a monitoring display unit connected to the monitoring unit, wherein said monitoring unit includes a comparison unit for comparing the direct current voltage with the reference voltage, and a monitoring control unit for detecting a signal of the comparison unit, said monitoring control unit being arranged to store the direct current voltage and displays information associated with the direct current voltage on the monitoring display unit when the malfunction occurs in the main power source.

2. The power source device according to claim 1, wherein said monitoring display unit is arranged to be driven by the reference voltage.

3. The power source device according to claim 1, wherein said monitoring unit power source is formed of a battery for outputting the reference voltage.

4. The power source device according to claim 1, wherein said monitoring unit power source is formed of a solar battery for outputting the reference voltage.

5. An image forming apparatus comprising the power source device according to claim 1.

6. The image forming apparatus according to claim 5, wherein said main power source is arranged to supply the direct current voltage to drive the image forming apparatus.

7. The power source device according to claim 1, wherein said monitoring unit power source is configured to output the reference voltage as a reference for detecting an excessive voltage of the main power source.

8. The power source device according to claim 7, wherein said monitoring unit is configured to determine that the malfunction occurs in the main power source when the direct current voltage exceeds the reference voltage.

9. An image forming apparatus for forming an image on a recording medium, comprising:
    a drive unit for transporting the recording medium;
    a control unit for controlling the drive unit;
    a main power source for outputting a first voltage to the control unit;
    an image forming unit for forming the image on the recording medium;
    a reference voltage generation unit for outputting a second voltage as a reference voltage;
    a comparison unit for comparing the first voltage with the second voltage;

a monitoring unit for monitoring whether a malfunction occurs in the main power source according to a comparison result of the comparison unit;

a monitoring display unit connected to the monitoring unit;

a storage unit for storing a measurement result when the monitoring unit detects that the malfunction occurs in the main power source; and a monitoring control unit for displaying the measurement result on the monitoring display unit.

10. The image forming apparatus according to claim 9, wherein said reference voltage generation unit is arranged to supply the reference voltage to the monitoring display unit.

11. The image forming apparatus according to claim 9, wherein said reference voltage generation unit is formed of a battery for outputting the reference voltage.

12. The image forming apparatus according to claim 9, wherein said reference voltage generation unit is formed of a solar battery for outputting the reference voltage.

13. The power source device according to claim 9, wherein said monitoring unit power source is configured to output the reference voltage as a reference for detecting an excessive voltage of the main power source.

14. The power source device according to claim 13, wherein said monitoring unit is configured to determine that the malfunction occurs in the main power source when the direct current voltage exceeds the reference voltage.

\* \* \* \* \*